(12) United States Patent
Huang

(10) Patent No.: US 10,483,998 B1
(45) Date of Patent: Nov. 19, 2019

(54) METHOD OF SIGNAL PROCESSING USING POLLING AND RELATED ANALOG-TO-DIGITAL CONVERTING SYSTEM

(71) Applicant: Wistron Corporation, New Taipei (TW)

(72) Inventor: Yi-Hsi Huang, New Taipei (TW)

(73) Assignee: Wistron Corporation, New Taipei (TW)

(*) Notice: Subject to any disclaimer, the term of this patent is extended or adjusted under 35 U.S.C. 154(b) by 0 days.

(21) Appl. No.: 16/167,512

(22) Filed: Oct. 22, 2018

(30) Foreign Application Priority Data

Jul. 10, 2018 (TW) .............................. 107123770 A

(51) Int. Cl.
  *H03M 1/12* (2006.01)
  *G06F 17/18* (2006.01)
(52) U.S. Cl.
  CPC .......... *H03M 1/1235* (2013.01); *G06F 17/18* (2013.01); *H03M 1/126* (2013.01); *H03M 1/1255* (2013.01)
(58) Field of Classification Search
  CPC ....... H03M 1/1255; H03M 1/126; H03M 1/24
  USPC ................................. 341/155, 122, 118, 120
  See application file for complete search history.

(56) References Cited

U.S. PATENT DOCUMENTS

| | | | |
|---|---|---|---|
| 5,950,185 A * | 9/1999 | Alon ...................... | G06Q 30/02 707/758 |
| 6,754,258 B1 * | 6/2004 | Abdelilah ............ | H04B 14/048 370/252 |
| 10,048,297 B2 * | 8/2018 | Motz ................... | H03M 1/0658 |

OTHER PUBLICATIONS

Ioannis Pitas et al., Order Statistics in Digital Image Processing, Proceedings of the IEEE, vol. 80, No. 12, Dec. 1992, pp. 1893-1921, XP000336364.

Yong Hoon Lee et al., Generalized Median Filtering and Related Nonlinear Filtering Techniques, IEEE Transactions on Acoustics, Speech, and Signal Processing, vol. ASSP-33, No. 3, Jun. 1985, pp. 672-683, XP55593051.

\* cited by examiner

*Primary Examiner* — Peguy Jean Pierre
(74) *Attorney, Agent, or Firm* — Winston Hsu

(57) ABSTRACT

A method of signal processing for handling a digital signal outputted by an analog-to-digital converter includes determining a candidate interval corresponding to each of multiple sampling points in a sampling space of the digital signal, wherein the candidate interval is one of multiple candidate intervals, calculating numbers of sampling points corresponding to each one of the multiple candidate intervals to determine a delegate candidate interval, and calculating a delegate value of the sampling space according to a number of sampling points corresponding to the delegate candidate interval and values of the sampling points corresponding to the delegate candidate interval.

6 Claims, 3 Drawing Sheets

METHOD OF SIGNAL PROCESSING USING POLLING AND RELATED ANALOG-TO-DIGITAL CONVERTING SYSTEM

BACKGROUND OF THE INVENTION

1. Field of the Invention

The present invention relates to a method of signal processing and related analog-to-digital converting system, and more particularly, to a method of signal processing using polling and related analog-to-digital converting system.

2. Description of the Prior Art

Analog-to-digital converter (ADC) is widely used in microcontroller field, such as an embedded control system. It is common in the industry to utilize a signal processor to reduce influences from the noise signal to the input signal. For example, common signal processing methods include average (or mean) method, median method, exponential weighted moving average (hereinafter abbreviated EWMA) method, and so on.

Applicant notices that the abovementioned signal processing methods need to be improved. For example, average (or mean) method is to calculate an average among all sampling points within a sampling interval as an output value, and therefore the output value is influenced by the noise. In particular, the influence increases when a difference between the noise and the input signal increases. Median method is to output a median among the sampling points within the sampling interval after sorting them out, and therefore the time for sorting leads to a lengthy latency.

EWMA method is to calculate an average among exponential weighted sampling points, wherein the weightings for the sampling points are exponentially decreased as time increases. For example, it gives the greater weighting to the newer sampling value, while it gives the smaller weighting to the older sampling value. However, when the input signal changes its signal level, the weighting calculation prolongs the latency.

FIG. 1 illustrates conversion curves using and not using EWMA method, wherein converted digital values not using EWMA method and outputted by the analog-to-digital converter are denoted with circles, and converted digital values outputted by the analog-to-digital converter using EWMA method are denoted with solid dots. Each of the circles and solid dots is generated at one cycle, and each cycle is an interval per unit time. In FIG. 1, given that a weighting exponent is 0.9, and the digital signal value changes from a value "0" to a value "1500" at a fifth cycle (e.g., a pressure sensor changes an analog signal when a pressure change is sensed at the fifth cycle, so as to change the corresponding digital signal value). As observe from FIG. 1, in the conversion curve using EWMA method, it reaches to the correct value "1500" until the forty-first cycle since the digital signal value has changed at the fifth cycle. For some embedded control system requiring instant response, a lengthy latency is intolerable.

Therefore, how to improve the signal processor of the analog-to-digital converter to meet the requirement for noise reduction and avoid lengthy latency has become a topic in the industry.

SUMMARY OF THE INVENTION

It is therefore an objective of the present invention to provide a method of signal processing using polling and related analog-to-digital converting system, to meet the requirement for noise reduction and shorten latency as much as possible.

The present invention discloses a signal processing method for handling a digital signal outputted by an analog-to-digital converter output including determining a candidate interval corresponding to each of multiple sampling points in a sampling space of the digital signal, wherein the candidate interval is one of multiple candidate intervals; calculating numbers of sampling points corresponding to each of the multiple candidate intervals to determine a delegate candidate interval; and calculating a delegate value of the sampling space according to a number of sampling points corresponding to the delegate candidate interval and values of the sampling points corresponding to the delegate candidate interval.

The present invention discloses an analog-to-digital converter system including an analog-to-digital converter configured to convert an analog signal into a digital signal; and a signal processor coupled to the analog-to-digital converter, and configured to perform signal processing to the digital signal to generate a delegate value. The signal processing includes determining a candidate interval corresponding to each of multiple sampling points in a sampling space of the digital signal, wherein the candidate interval is one of multiple candidate intervals; calculating numbers of sampling points corresponding to each of the multiple candidate intervals to determine a delegate candidate interval; and calculating a delegate value of the sampling space according to a number of sampling points corresponding to the delegate candidate interval and values of the sampling points corresponding to the delegate candidate interval.

For multiple sampling points in a sampling space, the present invention uses polling to determine a delegate candidate interval including the most sampling points, and then calculate a delegate value of the sampling space according to a number and values of sampling points corresponding to the delegate candidate interval. Therefore, it may exclude sampling points not included in the delegate candidate interval, so as to avoid the delegate value from influenced by the noise and avoid lengthy latency.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
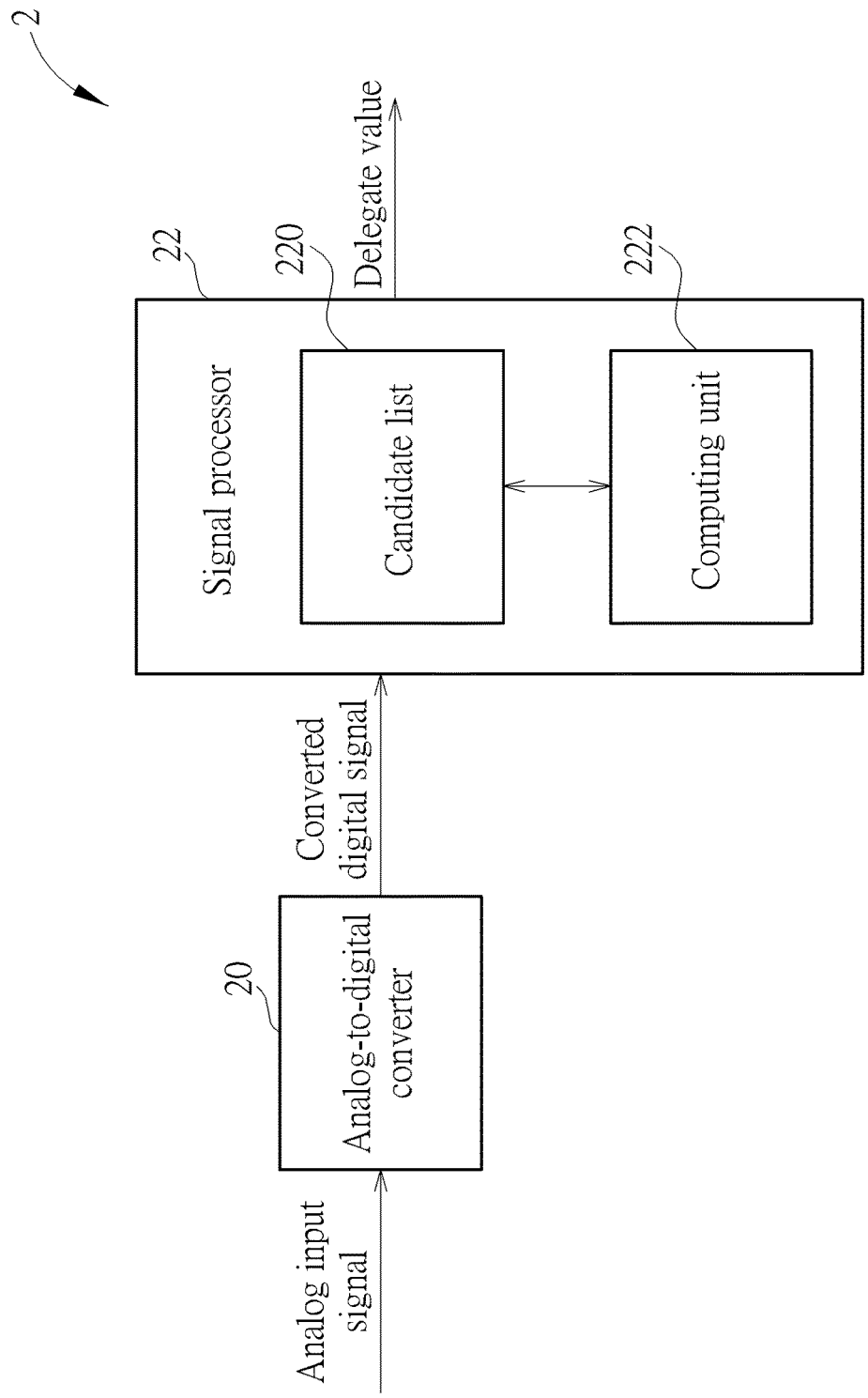
FIG. 2 is a functional block diagram of an analog-to-digital conversion system according to an embodiment of the present invention.

Please refer to FIG. 2, which is a functional block diagram of an analog-to-digital conversion system 2 according to an embodiment of the present invention. The analog-to-digital conversion system may be utilized in an embedded microcontroller system, and configured to convert an analog input signal into a digital output signal. The analog-to-digital conversion system 2 includes an analog-to-digital converter (hereinafter abbreviated ADC) 20 and a signal processor 22, wherein the signal processor 22 includes a candidate list 220 and a computing unit 222.

The ADC 20 is coupled to the signal processor 22, and configured to convert the analog input signal into digital values. The signal processor 22 is configured to perform signal processing to a group of sampling points (e.g., M sampling points) corresponding to a sampling interval to generate a delegate value corresponding to the sampling group to be the digital output signal. The candidate list 220 is configured to store multiple candidate intervals (e.g., N candidate intervals) and multiple groups of sampling points corresponding to the multiple candidate intervals. The computing unit 222 is coupled to the candidate list 220, and configured to determine a candidate interval corresponding to a sampling point, and count numbers of sampling points corresponding to the multiple candidate intervals, so as to perform polling and count votes of the candidate intervals. From another point of view, the signal processor 22 may perform classification according to values of the sampling points, and count numbers of the sampling points corresponding to multiple classes, so as to choose the delegate interval with the greatest number of the sampling points.

Figure 3:
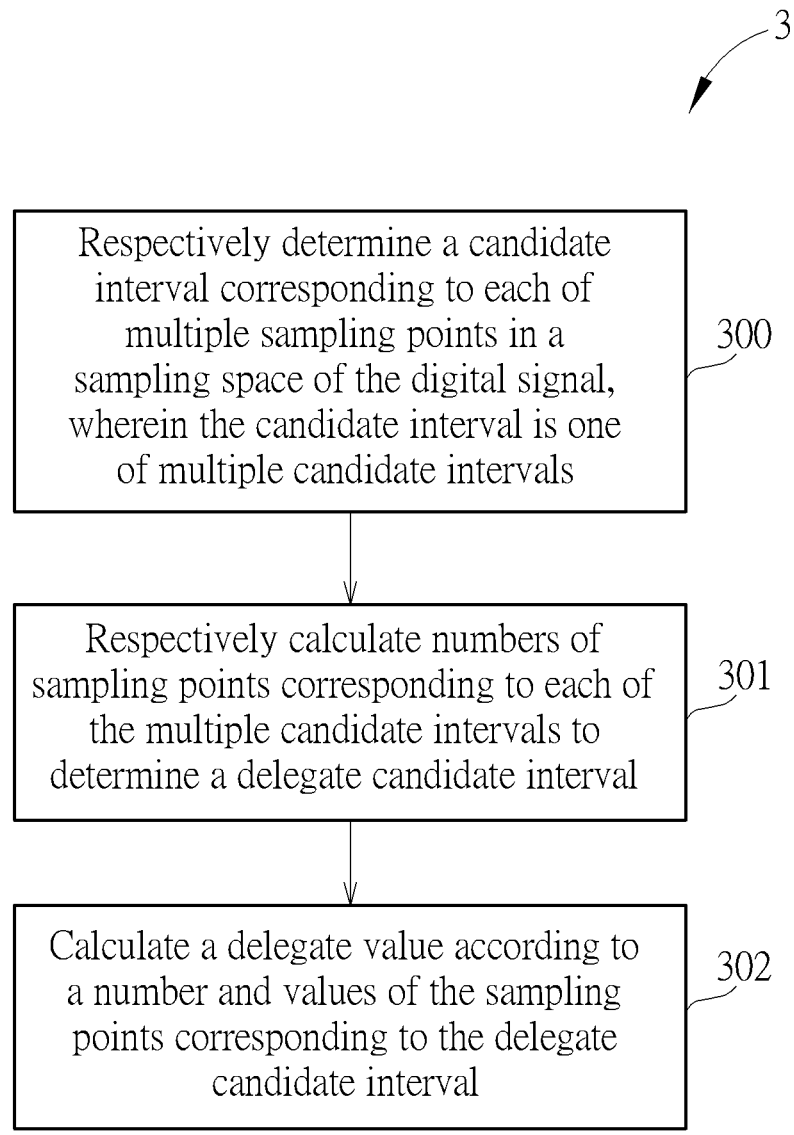
FIG. 3 is a flowchart of a signal processing process according to an embodiment of the present invention.

The signal processor 22 may perform a signal processing process 3 to calculate a delegate value corresponding to a group of sampling points in a sampling space, as shown in FIG. 3, the signal processing process 3 includes the following steps.

Step 300: Respectively determine a candidate interval corresponding to each of multiple sampling points in a sampling space of the digital signal, wherein the candidate interval is one of multiple candidate intervals.

Step 301: Respectively calculate numbers of sampling points corresponding to each of the multiple candidate intervals to determine a delegate candidate interval.

Step 302: Calculate a delegate value according to a number and values of the sampling points corresponding to the delegate candidate interval.

For example, given that the ADC 20 may output the converted digital signal with 12-bit, it may present 4096 values. Take 100 values as a group, then the candidate list 220 may include 41 candidate intervals 0~99, 100~199 . . . 3900~3999, and 4000~4095 (i.e., N=41). Given that a sampling size is 10 (i.e., M=10), and the ADC 20 may output a group of sampling points "4, 17, 14, 17, 5, 7, 9, 3, 1500, 15" to the signal processor 22. The computing unit 222 of the signal processor 22 may perform polling to the group of sampling points (Step 300), and calculate votes corresponding to each of the candidate intervals (Step 301). The following Table 1 illustrates polling result stored in the candidate list 220.

TABLE 1

| Candidate intervals | 0~99 | 1500~1599 |
|---|---|---|
| Sampling value | 4, 17, 14, 17, 5, 7, 9, 3, 15 | 1500 |
| Votes | 9 | 1 |

As can be seen from Table 1, there are 9 votes for the candidate interval 0~99, while there is only 1 vote for the candidate interval 1500~1599. Thus, it indicates that a number of sampling points corresponding to the candidate interval 0~99 is greater than a number of sampling points corresponding to the candidate interval 1500~1599, and thus a delegate candidate interval is determined to be the candidate interval 0~99 (Step 301). In one embodiment, when there are two candidate intervals with equal votes and also greater than votes for other candidate intervals, both the candidate intervals are the delegate candidate intervals.

In this embodiment, the signal processor 22 calculates an average among the sampling points corresponding to the delegate candidate intervals 0~99 (Step 302) to calculate the delegate value corresponding to the candidate interval, i.e., (4+17+14+17+5+7+9+3+15)/9=91/9=10.1, which is not limited.

In other words, the present invention uses polling to determine the delegate candidate interval corresponding to the most sampling points, which excludes sampling points out of the delegate candidate interval to avoid the delegate value from influences from other candidate intervals. Therefore, when the input analog signal contains a noise having a significant difference compared with the main signal, the noise may be excluded by polling or classification to avoid calculation error of the conventional average method. In mathematical theory, a time complexity for sorting n values may be expressed by a function BigO (n log n), while a time complexity for voting n values may be expressed by a function BigO (n). Therefore, the present invention may provide a shorter latency than the latency for the conventional median method.

Figure 1:
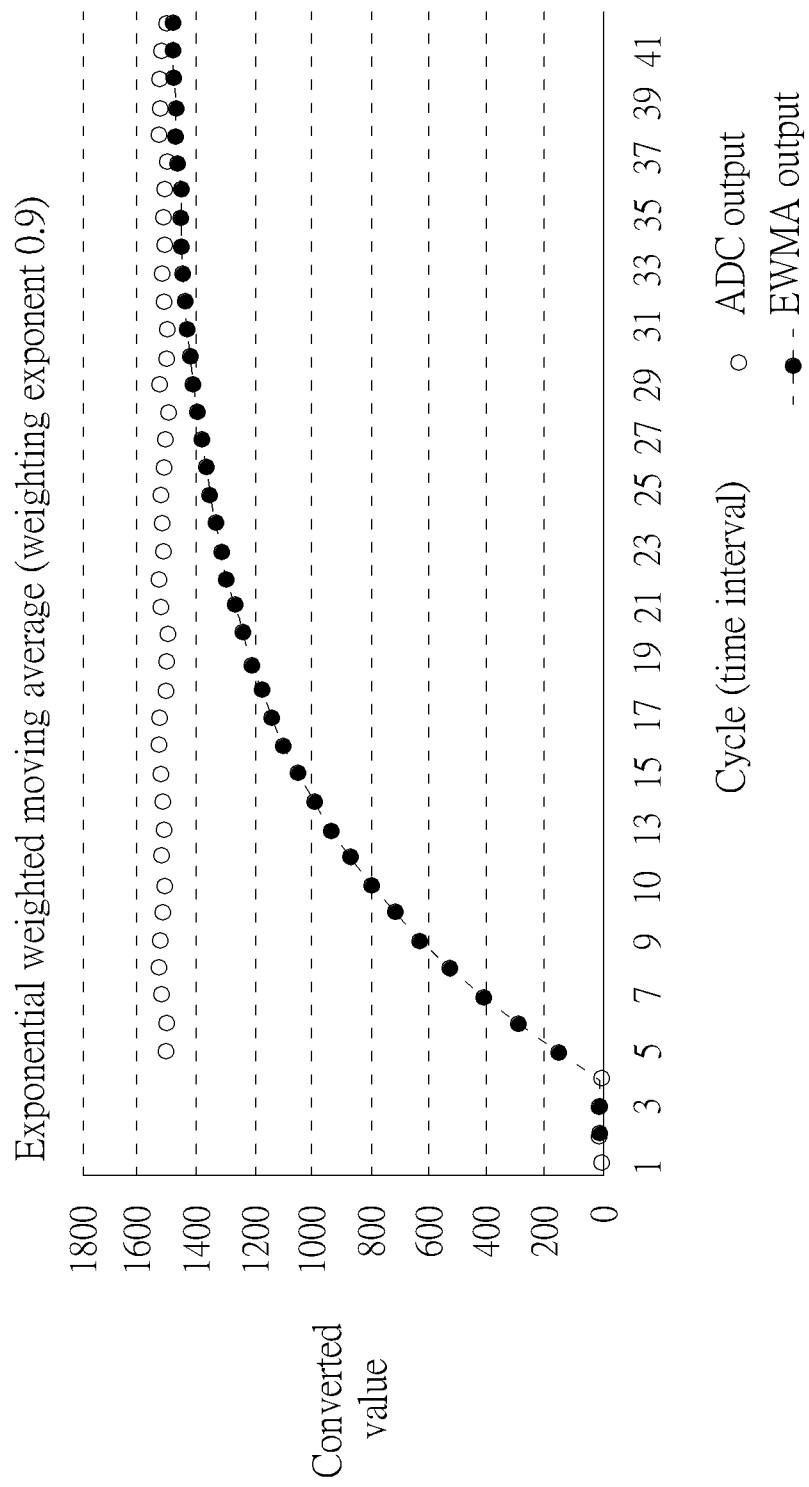
FIG. 1 illustrates conversion curves using and not using EWMA method according to the prior art.

In addition, since the present invention utilizes the delegate candidate intervals with the greatest votes to calculate the delegate value (i.e., the number of sampling points corresponding to the delegate candidate interval is the greatest among numbers of sampling points corresponding to the multiple candidate intervals), once the input signal level changes, take the input signal level changes from value "0" to value "1500" in FIG. 1 for example. There are four values "0" obtained from the first to fourth sampling cycles, there are five values "1500" obtained from the fifth to ninth sampling cycles, and the signal processor 22 of the present invention may output the correct delegate value at least by the time of the ninth sampling cycle. As can be seen, compare with the conventional EWMA method reaching to the correct value "1500" until the forty-first cycle, the present invention may provide a shorter latency.

Noticeably, those skilled in the art may make modifications and alterations according to practical requirements, which is not limited to the embodiments of the present invention. For example, a designer may set the number M of sampling points and weighting for the sampling space, the number N of candidate intervals and a range of the candidate interval, and duration of the sampling cycle according to practical requirements. In addition to using the average method to calculate the delegate value, the designer may use any method to calculate the delegate value; for example, randomly choosing a sampling value from the delegate candidate interval as the delegate value to speed up outputting the delegate value.

To sum up, for multiple sampling points in a sampling space, the present invention uses polling to determine a delegate candidate interval including the most sampling points, and then calculate a delegate value of the sampling space according to a number and values of sampling points corresponding to the delegate candidate interval. Therefore, it may exclude sampling points not included in the delegate candidate interval, so as to avoid the delegate value from influenced by the noise and avoid lengthy latency.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of signal processing for handling a digital signal outputted by an analog-to-digital converter, comprising:
 determining a candidate interval corresponding to each of multiple sampling points in a sampling space of the digital signal, wherein the candidate interval is one of multiple candidate intervals;
 calculating numbers of sampling points corresponding to each of the multiple candidate intervals to determine a delegate candidate interval; and
 calculating a delegate value of the sampling space according to a number of sampling points corresponding to the delegate candidate interval and values of the sampling points corresponding to the delegate candidate interval.

2. The method of signal processing of claim 1, wherein the number of sampling points corresponding to the delegate candidate interval is the greatest among numbers of sampling points corresponding to the multiple candidate intervals.

3. The method of signal processing of claim 1, wherein calculating the delegate value of the sampling space according to the number of sampling points corresponding to the delegate candidate interval and the values of the sampling points corresponding to the delegate candidate interval comprises:
 calculating an average among the values of the sampling points corresponding to the delegate candidate interval to calculate the delegate value of the sampling space.

4. An analog-to-digital converter system, comprising:
 an analog-to-digital converter configured to convert an analog signal into a digital signal; and
 a signal processor coupled to the analog-to-digital converter, and configured to perform signal processing to the digital signal to generate a delegate value, wherein the signal processing comprises:
  determining a candidate interval corresponding to multiple sampling points in a sampling space of the digital signal, wherein the candidate interval is one of multiple candidate intervals;
  calculating numbers of sampling points corresponding to each of the multiple candidate intervals to determine a delegate candidate interval; and
  calculating a delegate value of the sampling space according to a number of sampling points corresponding to the delegate candidate interval and values of the sampling points corresponding to the delegate candidate interval.

5. The analog-to-digital converter system of claim 4, wherein the number of sampling points corresponding to the delegate candidate interval is the greatest among numbers of sampling points corresponding to the multiple candidate intervals.

6. The analog-to-digital converter system of claim 4, wherein calculating the delegate value of the sampling space according to the number of sampling points corresponding to the delegate candidate interval and the values of the sampling points corresponding to the delegate candidate interval comprises:
 calculating an average among the values of the sampling points corresponding to the delegate candidate interval to calculate the delegate value of the sampling space.

* * * * *